(12) United States Patent
Mori

(10) Patent No.: US 9,859,179 B2
(45) Date of Patent: Jan. 2, 2018

(54) LID BODY, PACKAGE, AND ELECTRONIC APPARATUS

(71) Applicant: KYOCERA Corporation, Kyoto-shi, Kyoto (JP)

(72) Inventor: Ryuuji Mori, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 134 days.

(21) Appl. No.: 14/893,128

(22) PCT Filed: Sep. 24, 2014

(86) PCT No.: PCT/JP2014/075207
§ 371 (c)(1),
(2) Date: Nov. 23, 2015

(87) PCT Pub. No.: WO2015/046209
PCT Pub. Date: Apr. 2, 2015

(65) Prior Publication Data
US 2016/0105980 A1   Apr. 14, 2016

(30) Foreign Application Priority Data

Sep. 27, 2013  (JP) .................................. 2013-201735

(51) Int. Cl.
*H01L 23/10* (2006.01)
*H05K 7/02* (2006.01)
(Continued)

(52) U.S. Cl.
CPC ........... *H01L 23/10* (2013.01); *H05K 5/0095* (2013.01); *H05K 5/062* (2013.01); *H05K 7/02* (2013.01); *H01L 23/055* (2013.01); *H01L 23/26* (2013.01); *H01L 2224/48091* (2013.01); *H01L 2224/48227* (2013.01)

(58) Field of Classification Search
None
See application file for complete search history.

(56) References Cited

U.S. PATENT DOCUMENTS 6,335,271 B1 * 1/2002 Fukuyama .......... H01L 21/4853
257/E21.508
6,384,473 B1 * 5/2002 Peterson ............... B81B 7/0067
257/680

(Continued)

FOREIGN PATENT DOCUMENTS

JP   2010-223661 A   10/2010
JP   2011-249660 A   12/2011

OTHER PUBLICATIONS

Extended European Search Report, European Patent Application No. 14847934.8, Mar. 31, 2017, 6 pgs.

*Primary Examiner* — Zachary M Pape
*Assistant Examiner* — Douglas Burtner
(74) *Attorney, Agent, or Firm* — Volpe and Koenig, P.C.

(57) ABSTRACT

A lid body includes a plate body containing silicon; a protective film disposed on a main surface of the plate body, the protective film protecting the plate body from a joining brazing material; a frame-like hole passing through the protective film, the frame-like hole being provided at an outer periphery of the protective film; and a sealing metallic layer made of metal, disposed so as to fill in the hole.

10 Claims, 5 Drawing Sheets

(51) Int. Cl.
 *H05K 5/06* (2006.01)
 *H05K 5/00* (2006.01)
 *H01L 23/055* (2006.01)
 *H01L 23/26* (2006.01)

(56) References Cited

U.S. PATENT DOCUMENTS

| | | | | |
|---|---|---|---|---|
| 6,452,238 B1* | 9/2002 | Orcutt | B81B 7/007 | 257/414 |
| 6,661,084 B1* | 12/2003 | Peterson | H01L 25/105 | 257/680 |
| 6,809,413 B1* | 10/2004 | Peterson | B81B 7/0067 | 257/680 |
| 9,570,321 B1* | 2/2017 | Black | H01L 21/3225 | |
| 9,706,673 B2* | 7/2017 | Kawauchi | B23K 1/0016 | |
| 2002/0043706 A1* | 4/2002 | Jerominek | B81B 7/0077 | 257/680 |
| 2002/0060085 A1* | 5/2002 | Baba | H01L 21/4803 | 174/541 |
| 2003/0111441 A1* | 6/2003 | Jerominek | B81B 7/0077 | 216/39 |
| 2003/0146384 A1* | 8/2003 | Logsdon | H01L 23/10 | 250/338.1 |
| 2004/0087043 A1* | 5/2004 | Lee | B81C 1/00269 | 438/6 |
| 2004/0150118 A1* | 8/2004 | Honda | H01L 21/563 | 257/778 |
| 2006/0012016 A1* | 1/2006 | Betz | H01L 23/047 | 257/678 |
| 2006/0187608 A1* | 8/2006 | Stark | C03C 27/08 | 361/202 |
| 2006/0191215 A1* | 8/2006 | Stark | C03C 27/08 | 52/204.6 |
| 2007/0164424 A1* | 7/2007 | Dean | H01L 23/42 | 257/707 |
| 2007/0190691 A1* | 8/2007 | Humpston | B81C 1/00269 | 438/113 |
| 2008/0199982 A1* | 8/2008 | Greisen | H01L 33/486 | 438/26 |
| 2009/0001553 A1* | 1/2009 | Pahl | B81B 7/0064 | 257/704 |
| 2009/0001856 A1* | 1/2009 | Hara | H03H 9/0595 | 310/348 |
| 2009/0068070 A1* | 3/2009 | Hashimoto | B01J 19/249 | 422/129 |
| 2009/0224634 A1* | 9/2009 | Murakami | H03H 9/1021 | 310/348 |
| 2009/0229181 A1* | 9/2009 | Basho | B01J 19/0093 | 48/116 |
| 2011/0114840 A1* | 5/2011 | Yamazaki | G01J 5/04 | 250/338.1 |
| 2011/0115339 A1* | 5/2011 | Makibuchi | H01L 23/10 | 310/340 |
| 2012/0018871 A1* | 1/2012 | Lee | H01L 25/0655 | 257/698 |
| 2012/0096813 A1* | 4/2012 | Gooch | H01L 27/14618 | 53/452 |
| 2012/0138954 A1* | 6/2012 | Takagi | H01L 23/047 | 257/77 |
| 2014/0048913 A1* | 2/2014 | Park | H01L 23/552 | 257/659 |
| 2014/0240905 A1* | 8/2014 | Takahashi | H05K 5/062 | 361/679.01 |
| 2014/0291010 A1* | 10/2014 | Chiba | G01P 15/09 | 174/520 |
| 2015/0047893 A1* | 2/2015 | Akita | H01L 23/053 | 174/268 |
| 2015/0098171 A1* | 4/2015 | Nagatomo | H01L 23/10 | 361/679.01 |
| 2015/0116949 A1* | 4/2015 | Sato | B60W 10/00 | 361/728 |
| 2017/0125316 A1* | 5/2017 | Ichinohe | H01L 23/047 | |
| 2017/0148695 A1* | 5/2017 | Black | H01L 23/26 | |
| 2017/0179446 A1* | 6/2017 | Yokoi | H01M 2/0292 | |

* cited by examiner

LID BODY, PACKAGE, AND ELECTRONIC APPARATUS

TECHNICAL FIELD

The present invention relates to a lid body for electronic components for use with an electronic component which is in need of hermetic sealing and protection, as well as to a package and an electronic apparatus.

BACKGROUND ART

In a package in which is sealingly mounted an electronic component such as an infrared sensor, an acceleration sensor, a gyro sensor, or a quartz resonator, a decrease in internal pressure in the package is demanded to improve the characteristics of the electronic component. As a way to lower the internal pressure in the package, as disclosed in Patent Literature 1, there is known placement of a getter material inside the package. The placement of the getter material, onto which are adsorbed gas molecules present inside the package, helps reduce the internal pressure in the package. Moreover, according to Patent Literature 1, a wiring board and a lid body constituting the package are sealingly attached to each other via a brazing material.

CITATION LIST

Patent Literature

Patent Literature 1: Japanese Unexamined Patent Publication JP-A 2010-223661

SUMMARY OF INVENTION

Technical Problem

However, in the package disclosed in Patent Literature 1, when the wiring board and the lid body are sealingly attached to each other via a AuSn brazing material under a condition where, for example, a sealing metallic layer is disposed on the surface of the lid body formed of a silicon plate, then the AuSn brazing material extends around the side surface of the sealing metallic layer so as to be brought into contact with the silicon of the lid body, and, the silicon of the lid body and the AuSn brazing material react with each other due to heat generated during the sealing, thus causing diffusion of the AuSn brazing material into the silicon of the lid body. As a result, cracking occurs in the silicon of the lid body with consequent unsuccessful sealing, leading to the difficulty of lowering the internal pressure in the package.

Solution to Problem

A lid body according to the invention comprises: a plate body containing silicon; a protective film disposed on a main surface of the plate body, the protective film protecting the plate body from a joining brazing material; a frame-like hole passing through the protective film, the frame-like hole being provided at an outer periphery of the protective film; and a sealing metallic layer made of metal, disposed so as to fill in the hole.

A package according to the invention comprises: the lid body mentioned above; and a wiring board having a joining metallic layer disposed at an outer periphery of an upper surface of the wiring board so as to correspond to the sealing metallic layer.

An electronic apparatus according to the invention comprises: the package mentioned above; and an electronic component mounted in the package, the electronic component being hermetically sealed by joining the sealing metallic layer of the lid body to the joining metallic layer of the wiring board via the brazing material.

Advantageous Effects of Invention

The lid body according to the invention comprises: the plate body containing silicon; the protective film disposed on the main surface of the plate body, the protective film protecting the plate body from the joining brazing material; the frame-like hole passing through the protective film, the frame-like hole being provided at the outer periphery of the protective film; and the sealing metallic layer made of metal, disposed so as to fill in the hole. In this construction, since a AuSn brazing material, for example, is restrained against contact with the silicon-containing plate body of the lid body, it is possible to suppress occurrence of cracking in the plate body of the lid body, wherefore the package can be sealed successfully with the lid body, thus achieving effective reduction in internal pressure in the package.

The package according to the invention comprises: the lid body mentioned above; and the wiring board having the joining metallic layer disposed at the outer periphery of the upper surface of the wiring board so as to correspond to the sealing metallic layer. In this construction, the package can be sealed successfully, with consequent effective reduction in internal pressure in the package.

The electronic apparatus according to the invention comprises: the package mentioned above; and the electronic component mounted in the package, the electronic component being hermetically sealed by joining the sealing metallic layer of the lid body to the joining metallic layer of the wiring board via the brazing material. Accordingly, it is possible to keep the internal pressure of the sealing space low, and thereby allow the electronic component to operate satisfactorily.

DESCRIPTION OF EMBODIMENTS

Figure 1:
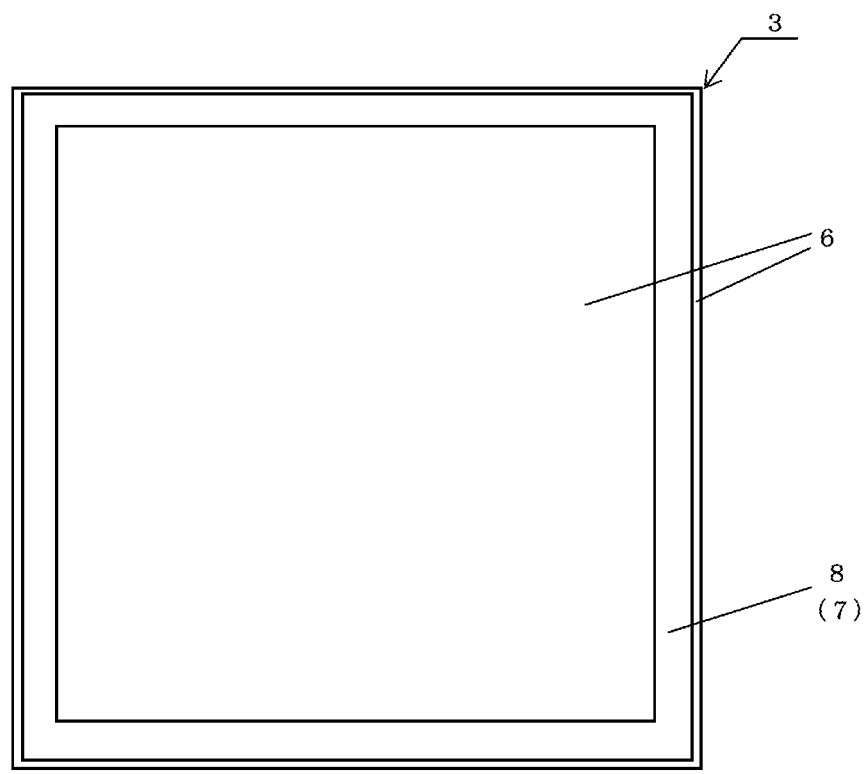
FIG. 1 is a bottom view showing a lid body in accordance with the embodiment of the invention.

Hereinafter, exemplificative embodiments of the invention will be described with reference to drawings.

A lid body, a package, and an electronic apparatus in accordance with the embodiment of the invention will be described with reference to FIGS. 1 to 5. In the present embodiment, the electronic apparatus comprises a package 1 and an electronic component 2.

The package 1 comprises a lid body 3 and a wiring board 4.

The lid body 3, which is joined onto the wiring board 4 so as to seal the wiring board 4, comprises: a plate body 5 containing Si (silicon); a protective film 6; a frame-like hole 7 passing through the protective film 6; and a sealing metallic layer 8 disposed so as to fill in the hole 7. The plate body 5 is formed of a Si-containing plate member, for example, a plate member composed solely of Si or a plate member composed predominantly of Si, Ge, ZnS, or an alloy of these metals, or a component composed of such plate members bonded together.

The lid body 3 has the protective film 6 disposed on the main surface of the plate body 5, or equivalently the sealing surface which is sealingly attached to the wiring board 4, and, the protective film 6, which is formed of a silicon oxide membrane for example, is provided to avoid that, when the wiring board 4 and the lid body 3 are joined together via a joining brazing material 10 made of AuSn for example, the brazing material 10 will be brought into contact with the plate body 5 of the lid body 3. The protective film 6 may either be disposed only on the main surface of the plate body 5 or be disposed on each of the upper surface and the side surface of the plate body 5.

The protective film 6 is formed by a thin-film forming technique such as vapor deposition, sputtering, or ion plating, by heat treatment, or otherwise.

The protective film 6 disposed on the main surface of the plate body 5 has, at the outer periphery thereof, the frame-like hole 7 passing therethrough. The hole 7 defines a protective film 6-free area to permit intimate contact of the sealing metallic layer 8 with the plate body 5. The sealing metallic layer 8 is disposed so as to fill in the hole 7.

The sealing metallic layer 8, which is made of chromium (Cr), titanium (Ti) or the like, is kept in intimate contact with the plate body 5. Like the protective film 6, the sealing metallic layer 8 is formed by a thin-film forming technique such as vapor deposition, sputtering, or ion plating.

Figure 3:
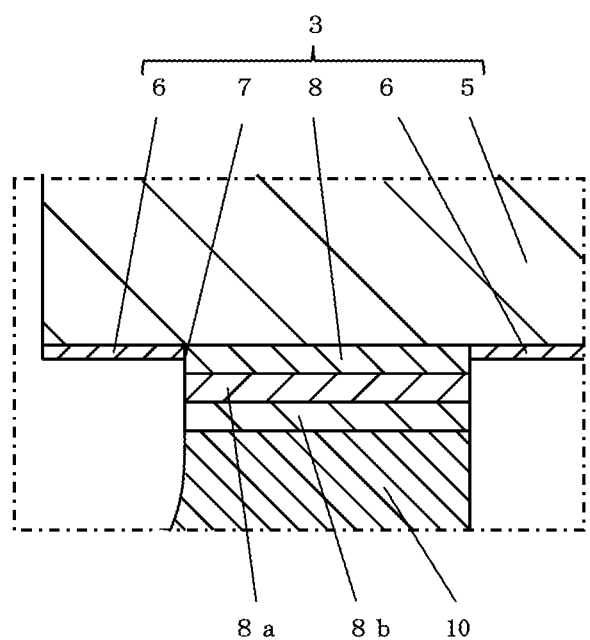
FIG. 3 is an enlarged main-part sectional view illustrating a section A shown in FIG. 2.
Figure 4:
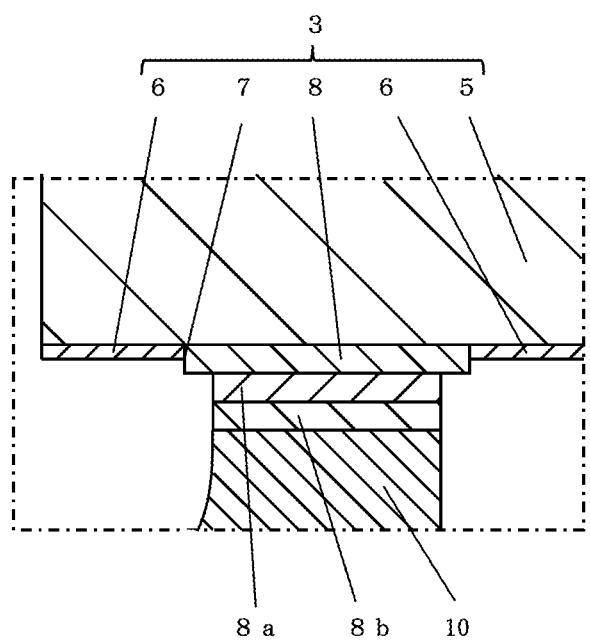
FIG. 4 is an enlarged main-part sectional view illustrating another example of the electronic apparatus in accordance with the embodiment of the invention.
Figure 5:
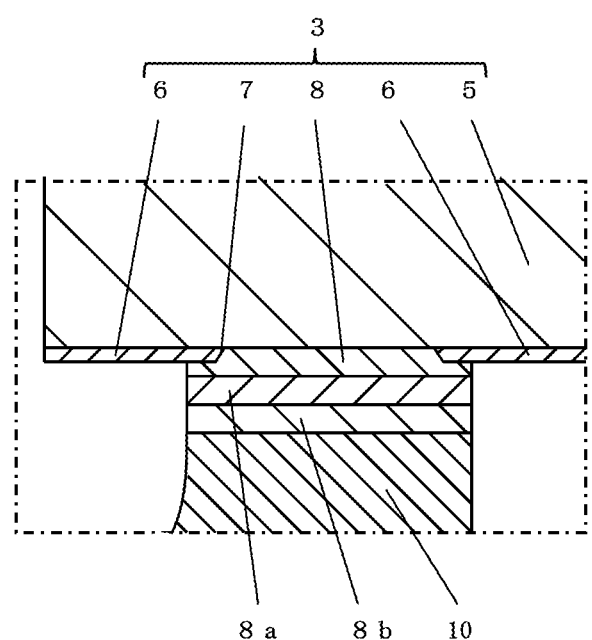
FIG. 5 is an enlarged main-part sectional view illustrating another example of the electronic apparatus in accordance with the embodiment of the invention.

As exemplified in FIGS. 3 to 5, the sealing metallic layer 8 may be provided with a diffusion suppressing layer 8a made of platinum (Pt), nickel (Ni) or the like for the case where the wiring board 4 and the lid body 3 are joined together via the joining brazing material 10 made of AuSn for example. With this construction, it is possible to suppress diffusion of the brazing material 10 into the lid body 3.

Moreover, as exemplified in FIGS. 3 to 5, the sealing metallic layer 8 or the diffusion suppressing layer 8a may be provided with an oxidation inhibiting layer 8b made of gold (Au) or the like. With this construction, it is possible to suppress oxidation of the sealing metallic layer 8 or the diffusion suppressing layer 8a.

The lid body 3 comprises: the plate body 5 containing silicon; the protective film 6 disposed on the main surface of the plate body 5, the protective film 6 protecting the plate body 5 from the joining brazing material 10; the frame-like hole 7 passing through the protective film 6; and the sealing metallic layer 8 made of metal, disposed so as to fill in the hole 7. In this construction, since the brazing material 10 is restrained against contact onto the plate body 5, it is possible to suppress occurrence of cracking in the plate body 5 of the lid body 3, wherefore the package 1 can be sealed successfully with the lid body 3, thus achieving effective reduction in internal pressure in the package 1.

Moreover, as exemplified in FIG. 4, by making the sealing metallic layer 8 larger in width than the diffusion suppressing layer 8a, when the wiring board 4 and the lid body 3 are joined together via the brazing material 10, even if the brazing material 10 extends around the side surface of the diffusion suppressing layer 8a, it is possible to cause the brazing material 10 to remain on the surface of the sealing metallic layer 8 so as not to extend around the side surface of the sealing metallic layer 8 for contact with the plate body 5 constituting the lid body 3, and thereby achieve effective suppression of occurrence of cracking in the plate body 5.

As exemplified in FIGS. 3 to 5, the sealing metallic layer 8 is preferably designed to have a thickness which is greater than the depth of the hole 7. With this construction, when the wiring board 4 and the lid body 3 are joined together via the brazing material 10, the brazing material 10 remains readily on the side surface of the sealing metallic layer 8 so as not to make contact with the plate body 5 constituting the lid body 3, with consequent effective suppression of occurrence of cracking in the plate body 5. As a result, the package 1 can be sealed more successfully with the lid body 3, thus achieving more effective reduction in internal pressure in the package 1.

Moreover, as exemplified in FIG. 5, the sealing metallic layer 8 is preferably designed so that its thickness is greater than the depth of the hole 7, and its outer edge extends over the surface of the protective film 6. With this construction, when the wiring board 4 and the lid body 3 are joined together via the brazing material 10, even if the brazing material 10 extends around the side surface of the sealing metallic layer 8, the brazing material 10 remains readily on the side surface of the protective film 6 so as not to make contact with the plate body 5 constituting the lid body 3, with consequent effective suppression of occurrence of cracking in the plate body 5. As a result, the package 1 can be sealed more successfully with the lid body 3, thus achieving more effective reduction in internal pressure in the package 1.

For example, the wiring board 4 is constructed by forming, on the surface or in the interior of a ceramic-made insulating substrate, a joining metallic layer 9, a wiring conductor, and an external terminal that will hereafter be described. Moreover, the insulating substrate is made of ceramics such as an aluminum oxide sintered body (alumina ceramics), an aluminum nitride sintered body, a mullite sintered body, or a glass-ceramics sintered body. Moreover, as exemplified in FIG. 2, the wiring board 4 has an internal recess in which the electronic component 2 is mounted and, this recess of the wiring board 4, in conjunction with the lid body 3, constitutes a sealing space. In a case where the wiring board 4 has the form of a recess-free flat plate, the lid body 3 is designed to have a recess capable of accommodating the electronic component 2 mounted on the wiring board 4 or a getter 11, or the wiring board 4 and the lid body 3 are sealingly joined together, with a frame body interposed between them.

The insulating substrate made of, for example, an aluminum oxide sintered body is formed by admixing suitable organic solvent and solution medium in raw material powder such for example as alumina ($Al_2O_3$), silica ($SiO_2$), calcia (CaO), or magnesia (MgO) to prepare a slurry, molding the slurry into sheet form by the doctor blade method, the calender roll method or otherwise to obtain a ceramic green sheet, subjecting the ceramic green sheet to appropriate punching process, and also, on an as needed basis, stacking a plurality of ceramic green sheets together to obtain a stacked body, and firing the stacked body at high temperature (ranging from about 1500 to 1800° C.)

The joining metallic layer 9, the wiring conductor, and the external terminal are made by metallization using metal powder such as tungsten (W), molybdenum (Mo), manganese (Mn), silver (Ag), or copper (Cu). Conductor pastes for forming the joining metallic layer 9, the wiring conductor, and the external terminal, respectively, are printed in predetermined configurations onto the ceramic green sheet for forming the insulating substrate by means of screen printing or otherwise, and then the pastes and the insulating substrate-forming ceramic green sheet are co-fired, whereby the joining metallic layer 9, the wiring conductor, and the external terminal are formed in their respective predetermined positions of the insulating substrate. Among wiring conductors, a through conductor passing through the ceramic green sheet in its thickness direction is obtained by printing a conductor paste so that the paste fills in a through hole created in the ceramic green sheet. The joining metallic layer 9 is formed in a frame shape at the outer periphery of the upper surface of the insulating substrate so as to correspond to the sealing metallic layer 8. With this construction, sealing can be accomplished between the lid body 3 and the wiring board 4 more effectively, thus achieving more effective reduction in internal pressure in the package 1.

Such a conductor paste is prepared by adding suitable organic solvent and organic binder, and also, on an as needed basis, a dispersant and so forth in the aforementioned metal powder, and mixing and kneading the resultant mixture, while adjusting the viscosity of the mixture to an adequate level, by kneading means such as a ball mill, a three roll mill, or a planetary mixer. Moreover, powder of glass or ceramics may be added to the conductor paste for adaptability to the sintering behavior of the ceramic green sheet or for enhancement in the strength of adhesion of the paste to the fired insulating substrate. The conductor paste for forming the through conductor is adjusted to have a higher viscosity for filling suitability than the wiring conductor layer-forming conductor paste by varying the type or the addition amount of the organic binder or the organic solvent.

The exposed surfaces of the joining metallic layer 9, the wiring conductor, and the external terminal are each covered with a plating layer by means of plating such as electrolytic plating or electroless plating. The plating layer is made of a metal which excels in corrosion resistance and in connectability with a connection member 2a and so forth, such as nickel or gold. For example, a nickel plating layer having a thickness of about 1 to 10 μm and a gold plating layer having a thickness of 0.1 to 3 μm are successively deposited onto the surface. This makes it possible to retard corrosion in the joining metallic layer 9, the wiring conductor, and the external terminal effectively, as well as to strengthen the joining with the lid body 3 which seals the recess via the brazing material 10, the joining with the connection member 2a, and the connection between the external terminal and the wiring of an external electric circuit board.

The electronic component 2 is constructed of an infrared sensor, an acceleration sensor, a gyro sensor, a quartz resonator or the like. For example, when an electronic apparatus for infrared sensor is produced, an infrared sensor is mounted in the recess as the electronic component 2. On the other hand, when an electronic apparatus for acceleration sensor is produced, an acceleration sensor is mounted in the recess as the electronic component 2. In the case of mounting an infrared sensor in the recess as the electronic component 2, the infrared sensor, which has a light-receiving section on an upper surface thereof for reception of infrared rays, is placed so as to be joined to the bottom surface of the recess of the wiring board 4 via a joining material such as a brazing material or solder. Moreover, the infrared sensor is electrically connected to the wiring conductor via the connection member 2a constructed of a bonding wire for example.

Figure 2:
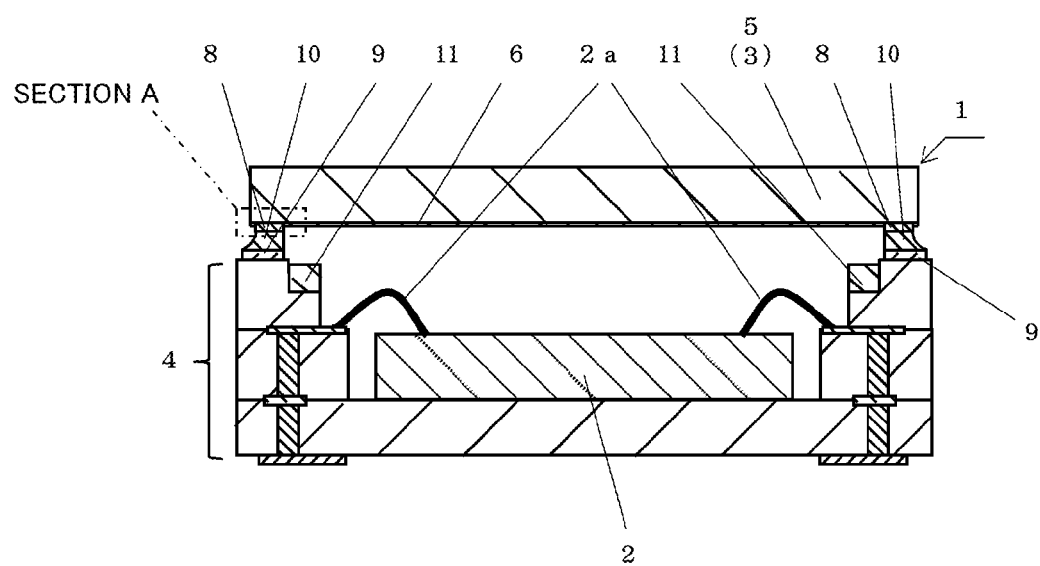
FIG. 2 is a sectional view showing an electronic apparatus in accordance with the embodiment of the invention.

In the interior space of the electronic apparatus in which the electronic component 2 is hermetically sealed, as exemplified in FIG. 2, there is mounted a getter 11 capable of adsorption of gas molecules present within the sealing space, thus achieving more effective reduction in internal pressure in the package 1.

A chemically active member is used for the getter 11. More specifically, use can be made of metals composed predominantly of titanium (Ti), zirconium (Zr), iron (Fe), and vanadium (V), respectively. Powder of such a metal is mixed with an organic solvent such as nitrocellulose resin or ethylcellulose resin to prepare a conductor paste. The conductor paste is printed in a predetermined thickness onto desired positions of the surface of a through hole-bearing metal plate made of iron (Fe), tungsten (W), nichrome, stainless steel or the like by means of screen printing or otherwise, and is then heated in an atmosphere of an inert gas (for example, in an atmosphere of argon (Ar) gas) or a vacuum atmosphere at a temperature of 250 to 500° C. to remove the organic solvent by evaporation. In this way, there is obtained the getter 11 constructed of a metal plate having a getter material on both sides thereof. The getter material may be placed on the surface of the metal plate by a method in general use such as vapor deposition or sputtering.

The electronic apparatus comprises the package 1 and the electronic component 2 mounted in the package 1, and the sealing metallic layer 8 of the lid body 3 is joined to the joining metallic layer 9 of the wiring board 4 via the brazing material 10 to seal the electronic component 2 hermetically. Accordingly, it is possible to keep the internal pressure of the sealing space low, and thereby allow the electronic component 2 to operate satisfactorily.

The following describes the details of a method for manufacturing an electronic apparatus according to the invention.

There is prepared a wiring board 4 formed with a recess, a joining metallic layer 9, a wiring conductor, and an external terminal. More specifically, the wiring board 4 can be produced by preparing a ceramic green sheet composed predominantly of a ceramic material such as alumina ceramics or mullite ceramics, subjecting the ceramic green sheet to punching process using a punch die conforming to a sidewall part of the recess, while printing a joining metallic layer 9-forming conductor paste made by metallization using metal powder such as W, Mo, Mn, Ag, or Cu onto the ceramic green sheet so as to lie, in a frame form, around a part of the ceramic green sheet which becomes the recess, and similarly printing conductor pastes for forming the wiring conductor and the external terminal in predetermined configurations by means of screen printing or otherwise, forming a stacked body by stacking conductor paste-bearing ceramic green sheets together so as to define the recess, and firing this stacked body. In addition, an electronic-component mounting conductor is formed on the bottom surface of the recess of the wiring board 4 in a manner similar to the joining metallic layer 9 or the like.

Then, an electronic component 2 such as an infrared sensor is mounted on the electronic-component mounting conductor located on the bottom surface of the recess via a joining material such as a brazing material or solder made of a metal composed predominantly of Au, Ag, Zn, Sn, Cu, or an alloy of these metals. Moreover, the electronic component 2 is electrically connected to the wiring conductor formed on the wiring board 4 by means of wire bonding or flip-chip mounting.

Next, a getter 11 is placed inside the recess of the wiring board 4, and, a lid body 3 is placed on the wiring board 4 so as to seal the recess. When an infrared sensor is used as the electronic component 2, it is advisable that the lid body 3 is capable of sealing the recess while permitting transmission of infrared rays. In the lid body 3, a plate member composed solely of Si or a plate member predominantly composed of Si as an essential element, and Ge, ZnS, an alloy of these metals, or a component composed of such plate members bonded together, or the like may be used as a plate body 5.

At this time, the wiring board 4 and the lid 3 are joined together via a brazing material 10. As the AuSn-made joining brazing material 10, for example, one in a preform form, one cladded on the lid body 3, or one in a paste form may be used. Moreover, such a brazing material 10 may be placed on the joining surfaces of the joining metallic layer 9 of the wiring board 4 and the sealing metallic layer 8 of the lid body 3, or alternatively, the brazing material 10 in a paste form may be placed on the joining surfaces of the wiring board 4 and the lid body 3 by means of printing. The brazing material 10 thereby placed on the joining surfaces of the wiring board 4 and the lid body 3 is heated to melt by an infrared lamp heater, a heater block, a heater plate or the like, thus permitting the joining together of the wiring board 4 and the lid body 3 via the brazing material 10.

The step of sealing the recess with the lid body 3 is performed under a pressure lower than atmospheric pressure. More specifically, a pressure-reducing device such as a vacuum chamber is used to seal the recess under a pressure lower than atmospheric pressure. At this time, the degree of vacuum is set to an adequate level in accordance with the required internal pressure in the sealing space with use of the pressure-reducing device.

It is preferable that the procedure in the manufacture of the electronic apparatus includes a step of heating the getter 11. By applying heat to the getter 11, it is possible to form a new active surface on the surface of the getter 11, and thereby increase the gas molecule-adsorption effect provided by the getter 11.

It is particularly desirable to heat the getter 11 to allow it to become active in the step of joining the lid body 3 and the wiring board 4 together. In the step of joining the lid body 3 and the wiring board 4 together, since the wiring board 4 and the lid body 3 are joined together under application of heat, it follows that gas tends to be generated from the wiring board 4 and the lid body 3, and also from the brazing material 10. In light of this, by causing the getter 11 to become active in the step of joining the lid body 3 and the wiring board 4 together, it is possible to increase the gas molecule-adsorption effect provided by the getter 11, and thereby achieve further reduction in internal pressure in the sealing space of the electronic apparatus.

It should be understood that the application of the invention is not limited to the embodiments described heretofore, and that various changes and modifications are possible without departing from the scope of the invention.

The invention claimed is:

1. A lid body, comprising:
   a plate body containing silicon;
   a protective film disposed on a main surface of the plate body, the protective film protecting the plate body from a joining brazing material;
   a frame-like hole passing through the protective film, the frame-like hole being provided at an outer periphery of the protective film; and
   a sealing metallic layer made of metal, disposed so as to fill in the hole.

2. The lid body according to claim 1,
   wherein the sealing metallic layer has a thickness which is greater than a depth of the hole.

3. The lid body according to claim 2,
   wherein the sealing metallic layer has an outer edge thereof extending over a surface of the protective film.

4. The lid body according to claim 1,
   wherein the sealing metallic layer has a diffusion suppressing layer for restraining the brazing material from diffusion into the lid body.

5. The lid body according to claim 4,
   wherein the sealing metallic layer is larger in width than the diffusion suppressing layer.

6. The lid body according to claim 1,
   wherein the sealing metallic layer has an oxidation inhibiting layer.

7. The lid body according to claim 4,
   wherein the diffusion suppressing layer has an oxidation inhibiting layer.

8. A package, comprising:
   the lid body according to claim 1; and
   a wiring board having a joining metallic layer disposed at an outer periphery of an upper surface of the wiring board so as to correspond to the sealing metallic layer.

9. An electronic apparatus, comprising:
   the package according to claim 8; and
   an electronic component mounted in the package,
   the electronic component being hermetically sealed by joining the sealing metallic layer of the lid body to the joining metallic layer of the wiring board via the brazing material.

10. The electronic apparatus according to claim 9,
    wherein a getter is mounted in a space in which the electronic component is hermetically sealed.

* * * * *